(12) United States Patent
Qin et al.

(10) Patent No.: US 8,524,572 B2
(45) Date of Patent: Sep. 3, 2013

(54) METHODS OF PROCESSING UNITS COMPRISING CRYSTALLINE MATERIALS, AND METHODS OF FORMING SEMICONDUCTOR-ON-INSULATOR CONSTRUCTIONS

(75) Inventors: Shu Qin, Boise, ID (US); Ming Zhang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 13/267,522

(22) Filed: Oct. 6, 2011

(65) Prior Publication Data

US 2013/0089966 A1 Apr. 11, 2013

(51) Int. Cl.
*H01L 21/30* (2006.01)
(52) U.S. Cl.
USPC ......... 438/457; 438/458; 438/459; 257/E21.6
(58) Field of Classification Search
USPC ................. 438/457, 458, 459; 257/E21.6
See application file for complete search history.

(56) References Cited

U.S. PATENT DOCUMENTS

| | | | |
|---|---|---|---|
| 6,865,065 B1 * | 3/2005 | Chen et al. .......... | 361/234 |
| 7,060,590 B2 | 6/2006 | Bressot et al. | |
| 7,265,028 B2 * | 9/2007 | Xie ................. | 438/457 |
| 7,759,220 B2 | 7/2010 | Henley | |
| 7,811,900 B2 | 10/2010 | Henley | |
| 7,871,849 B2 | 1/2011 | Arai | |
| 8,349,702 B2 | 1/2013 | Kato et al. | |
| 2006/0205180 A1 | 9/2006 | Henley et al. | |
| 2006/0292822 A1 | 12/2006 | Xie | |
| 2007/0141740 A1 | 6/2007 | Theodore et al. | |
| 2009/0277314 A1 | 11/2009 | Henley | |
| 2010/0055874 A1 | 3/2010 | Henley | |

FOREIGN PATENT DOCUMENTS

| | | |
|---|---|---|
| CN | 101698467 A | 4/2010 |
| WO | WO PCT/US2012/054235 | 2/2013 |

OTHER PUBLICATIONS

Bruel, "Silicon on insulator material technology", Electronics Letters, vol. 31(14), Jul. 6, 1995, pp. 1201-1202.
Huang et al., "LOCOS-Induced Stress Effects on Thin-Film SOI Devices", IEEE Transactions on Electron Devices, vol. 44(4), Apr. 1997, pp. 646-650.
Qin et al., "Wafer dependence of Johnsen-Rahbek type electrostatis chuck for semiconductor processes", American Institutes of Physics, Journal of Applied Physics, 102, 2007, pp. 064901-1 to 064901-4.

* cited by examiner

*Primary Examiner* — Trung Q Dang
(74) *Attorney, Agent, or Firm* — Wells St. John P.S.

(57) ABSTRACT

Some embodiments include methods of processing a unit containing crystalline material. A damage region may be formed within the crystalline material, and a portion of the unit may be above the damage region. A chuck may be used to bend the unit and thereby induce cleavage along the damage region to form a structure from the portion of the unit above the damage region. Some embodiments include methods of forming semiconductor-on-insulator constructions. A unit may be formed to have dielectric material over monocrystalline semiconductor material. A damage region may be formed within the monocrystalline semiconductor material, and a portion of the monocrystalline semiconductor material may be between the damage region and the dielectric material. The unit may be incorporated into an assembly with a handle component, and a chuck may be used to contort the assembly and thereby induce cleavage along the damage region.

5 Claims, 4 Drawing Sheets

METHODS OF PROCESSING UNITS COMPRISING CRYSTALLINE MATERIALS, AND METHODS OF FORMING SEMICONDUCTOR-ON-INSULATOR CONSTRUCTIONS

TECHNICAL FIELD

Methods of processing units comprising crystalline materials, and methods of forming semiconductor-on-insulator constructions.

BACKGROUND

Smart-cut technology is a process for forming semiconductor-on-insulator (SOI) constructions. An example process sequence that may be utilized in smart-cut technology is described by Bruel (M. Bruel, Electronics Letters, Jul. 6, 1995; Vol. 31, No. 14, pp 1201-1202). The process sequence comprises formation of silicon dioxide over a first monocrystalline silicon wafer, followed by implantation of hydrogen ions into the wafer to form a damage region. The damage region is spaced from the silicon dioxide by an intervening portion of the monocrystalline silicon material of the wafer. Subsequently, the wafer is bonded to a handle component (which can be a second semiconductor wafer) by hydrophilic bonding through the silicon oxide. The damage region is then thermally treated with a two-phase process. The two-phase process comprises first heating the damage region to a temperature of from about 400° C. to about 600° C. to split the wafer along the damage region (forming an SOI structure having a thin layer of monocrystalline bonded to the handle portion, and also forming a second structure corresponding to monocrystalline silicon which can be recycled into the process as a starting monocrystalline silicon wafer). The two-phase process then comprises heating the SOI structure to a temperature of greater than or equal to 1000° C. to strengthen chemical bonds. Although Bruel states that the first phase of the thermal treatment utilizes a temperature of from about 400° C. to about 600° C., it has been determined subsequent to Bruel that the first phase may be conducted utilizing a temperature of from about 200° C. to about 600° C.; and specifically that co-implants can be utilized to reduce the temperature utilized for such first phase.

Subsequent processing of the SOI structure may comprise chemical-mechanical polishing (CMP) to reduce surface roughness along an outer surface of the thin layer of monocrystalline silicon (i.e., along the surface that had formed during the break along the damage region).

Existing smart-cut processes can be expensive due to the large amount of hydrogen utilized in forming the damage regions. Another problem with existing smart-cut processes can be that the surface formed by breaking the damage region may be very rough, so that extensive CMP is required, which can reduce throughput and increase costs.

For the above-discussed reasons, it would be desirable to develop new smart-cut-type processes which can utilize less hydrogen than existing processes and/or which may have improved surfaces formed along the damage regions to reduce, or possibly even eliminate, subsequent CMP of such surfaces.

DETAILED DESCRIPTION OF THE ILLUSTRATED EMBODIMENTS

Some embodiments include new smart-cut-type processing in which a curved surface of a chuck is utilized to contort a wafer after formation of a damage region, and to thereby enhance breakage along the damage region. Such may enable less hydrogen to be utilized in forming the damage region relative to conventional smart-cut processes; and/or may enable a surface of an SOI to be formed with substantially reduced roughness, which may eliminate a CMP step utilized in conventional smart-cut processes, or which may at least reduce the amount of CMP relative to conventional smart-cut processes.

Any suitable chuck may be utilized in the embodiments described herein. In some embodiments, the chuck may be an electrostatic chuck; such as, for example, a Johnsen-Rahbek (J-R)-type chuck.

Example embodiments are described with reference to FIGS. 1-15.

FIGS. 1-9 illustrate an example embodiment smart-cut-type process.

Figure 1:
FIGS. 1-4 are diagrammatic, cross-sectional views of a portion of a construction at various process stages of an example embodiment process.

Referring to FIG. 1, a portion of a construction 10 is illustrated. The construction comprises a crystalline material 12 having a dielectric material 14 thereover. In some embodiments, the construction 10 may be considered to correspond to a unit 16 comprising crystalline material. A "unit" comprising crystalline material is any construction comprising crystalline material. The "unit" may comprise the crystalline material alone, or in combination with one or more other materials; and in the shown embodiment of FIG. 1 the "unit" comprises the crystalline material in combination with the dielectric material 14.

In some embodiments, the crystalline material 12 may comprise, consist essentially of, or consist of a semiconductor material; and may, for example, comprise, consist essentially of, or consist of monocrystalline silicon. In some embodiments, the monocrystalline silicon may be configured as a wafer of appropriate composition and dimension to be suitable for integrated circuit fabrication.

The dielectric material 14 may comprise, consist essentially of, or consist of silicon dioxide in some embodiments. For instance, in some embodiments, the crystalline material 12 may comprise monocrystalline silicon, and the dielectric material 14 may comprise a region of silicon dioxide thermally grown across a surface of the monocrystalline silicon.

Figure 2:
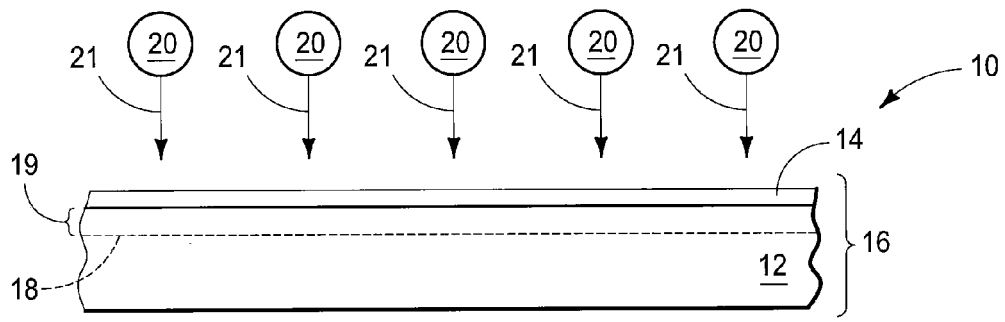

Referring to FIG. 2, a damage region 18 (diagrammatically illustrated with a dashed line) is formed within the crystalline material 12. The damage region may be formed with any suitable processing. In the shown embodiment, hydrogen 20 is implanted through the dielectric material 14 to form the damage region (with the implant being represented by the arrows 21). The hydrogen may be in any suitable form, and in some embodiments may comprise hydrogen ions. The implanted hydrogen may be provided at any suitable dosage. In some embodiments, the implanted hydrogen may be provided at a dosage less than the conventional dosage utilized for forming a damage region with hydrogen in smart-cut processing (with a conventional dosage typically being about $1 \times 10^{17}$ particles/cm$^2$; with the term "particles" referring to the species of hydrogen present in the implant, such as hydrogen ions). In some embodiments, the implanted hydrogen may be provided at a dosage less than one-half of the conventional dosage, such as, for example, a dosage of from about one-quarter to about one-half of the conventional dosage. For instance, the hydrogen may be provided at a dosage of from about $2 \times 10^{16}$ particles/cm$^2$ to about $5 \times 10^{16}$ particles/cm$^2$. Although hydrogen is described in the specific example embodiment described above and in other example embodiments in this disclosure; in some embodiments, helium and/or other ions may be substituted for hydrogen, or utilized in addition to hydrogen, to form a damage region.

The utilization of a low dose of hydrogen may enable example embodiment processes of the present invention to be performed at reduced costs relative to conventional smart-cut type processes. Further, the utilization of a lower dosage of hydrogen may increase throughput. For instance, it may take about 30 minutes to implant a conventional dose of hydrogen; and embodiments that utilize from about one-quarter to about one-half of the conventional dosage may be accomplished in from about from about one-quarter to about one-half of the conventional time.

Although it may be advantageous to utilize a low dose of hydrogen in some embodiments, in other embodiments the dosage of hydrogen may be about the same as that utilized in conventional processes, and may be, for example, at least about $1 \times 10^{17}$ particles/cm$^2$. If the dose of hydrogen utilized to form the damage region is about the same as that utilized in conventional processes, the embodiments may not save hydrogen-usage costs as compared to conventional processes. However, the embodiments may still have advantages relative to conventional smart-cut processes (such as, for example, reducing subsequent CMP), as discussed below.

The damage region 18 is spaced from the dielectric material 14, and accordingly a portion 19 of crystalline material 12 is between the dielectric material and the damage region.

Figure 3:
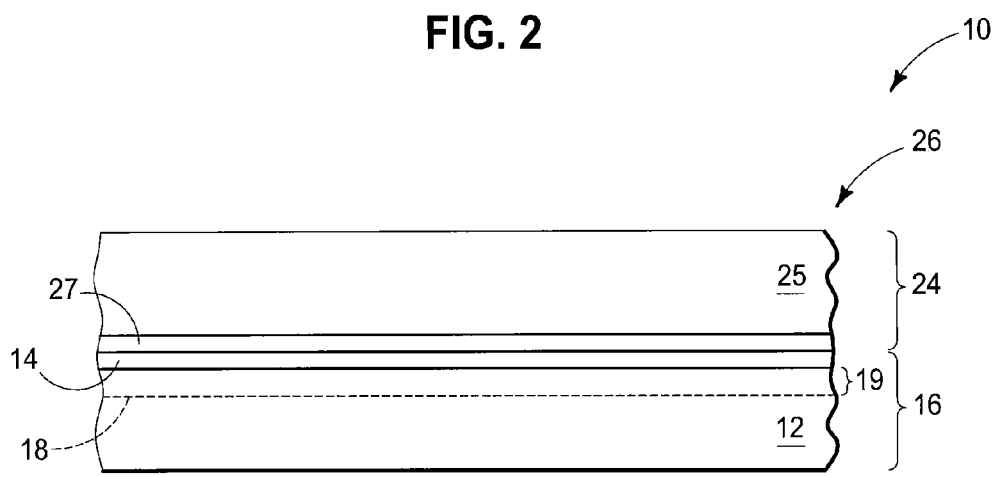

Referring to FIG. 3, the unit 16 is shown to be bonded to a handle component 24 to form an assembly 26. The illustrated handle component comprises a semiconductor wafer 25 and a dielectric material 27 adjacent semiconductor material of the wafer. In some embodiments, the semiconductor wafer 25 may comprise, consist essentially of or consist of monocrystalline silicon, and the dielectric material 27 may comprise, consist essentially of, or consist of silicon dioxide. The handle component 24 may be bonded to the unit 16 by hydrophilic bonding of the dielectric material 27 of the handle component to the dielectric material 14 of the unit 16. Although the dielectric materials 14 and 27 are shown to be separate from one another in the assembly 26, in some embodiments the dielectric materials 14 and 27 may be the same composition as one another and may merge to form a single dielectric material between the crystalline material 12 and the semiconductor material 25. Also, although both the handle component 24 and the unit 16 are shown to initially comprise dielectric materials, in other embodiments only one of the handle component and the unit 16 may initially have the dielectric material and may be bonded to the other of the handle component and the unit through such dielectric material.

Figure 4:
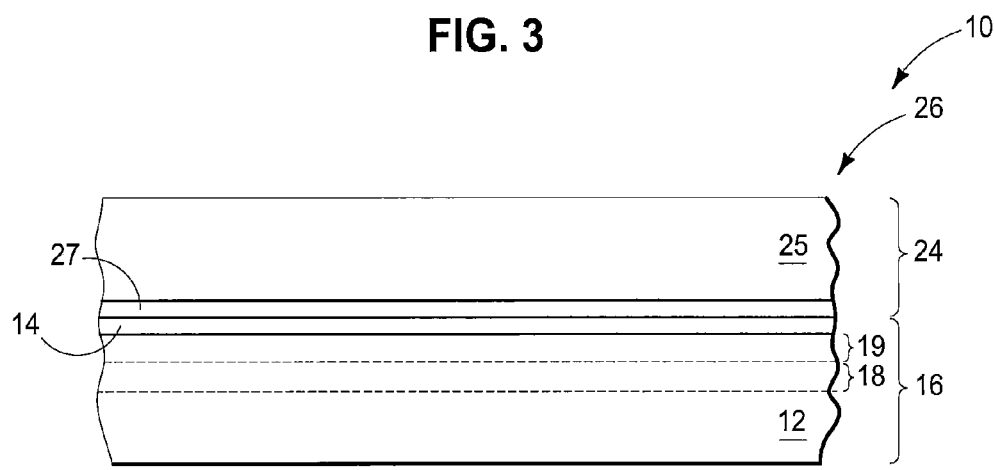

Referring to FIG. 4, the damage region 18 is thermally treated to expand such damage region. Such thermal treatment may comprise similar conditions as conventional thermal treatments of a damage region during smart-cut processing and may, for example, comprise maintaining the damage region at a temperature of from about 200° C. to about 600° C. for a duration of about 30 minutes. The thermal processing of FIG. 4 may be optional in some embodiments. For instance, it may be advantageous to utilize the thermal processing of FIG. 4 when relatively low doses of hydrogen are initially implanted, and it may be unnecessary to utilize such thermal processing when conventional doses of hydrogen are implanted.

Figure 5:
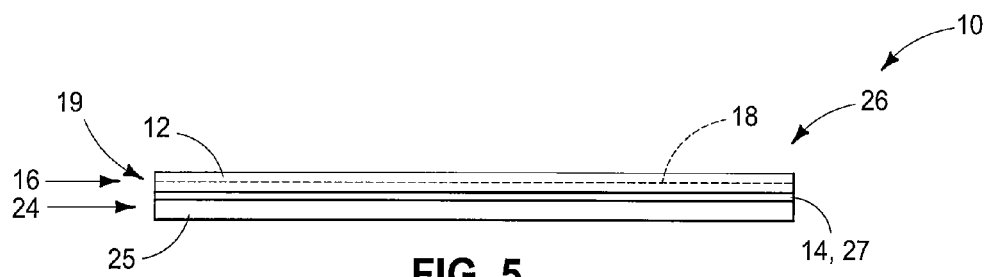
FIG. 5 is a diagrammatic, cross-sectional view of the construction of FIG. 4, shown at a different scale than used in FIG. 4; with FIG. 5 showing an entirety of the construction.

Referring to FIG. 5, the construction 10 of FIG. 4 is shown inverted relative to FIG. 4, and is shown at a different scale than FIG. 4. Specifically, the scale utilized in FIG. 5 enables an entire width of the assembly 26 to the illustrated. The dielectric material which joins the handle component 24 to the unit 16 is shown as a single dielectric material "14, 27"; rather than being shown as two separate dielectric materials, in order to simplify the drawing.

Figure 6:
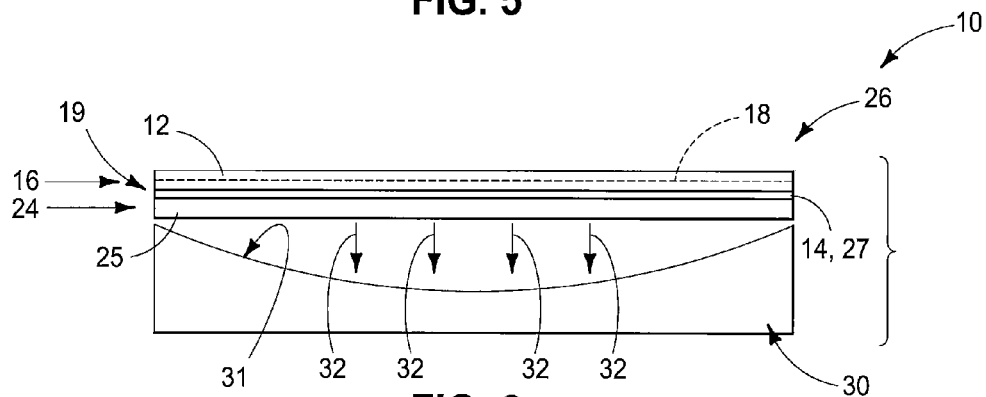
FIG. 6 is a diagrammatic, cross-sectional view of the construction of FIG. 5 adjacent a chuck at a process stage of an example embodiment process.

Referring to FIG. 6, the assembly is provided adjacent a chuck 30. The chuck comprises a curved outer surface 31 (specifically, a curved outer surface with a concave topography in the embodiment of FIG. 6), and the assembly 26 is directed toward such curved surface (as indicated by arrows 32) to contort the assembly. In the shown embodiment, the contortion comprises bending the assembly along the curved surface 30, but in other embodiments other contortions of the assembly may be accomplished with other embodiments of chucks.

The chuck 30 may comprise any suitable chuck, and in some embodiments may comprise an electrostatic chuck. If the chuck 30 is an electrostatic chuck, it may be advantageous for the chuck to be a Johnsen-Rahbek-type electrostatic chuck for reasons analogous to the advantages discussed in an article by Qin and McTeer (S. Qin and A. McTeer, "Wafer dependence of Johnsen-Rahbek type electrostatic chuck for semiconductor processes," Journal of Applied Physics 102, 064901-1 (2007)). Example Johnsen-Rahbek-type electrostatic chucks are described below with reference to FIGS. 13-15.

The assembly 26 is engaged by the surface 31 to contort the assembly. The illustrated degree of curvature of the surface of chuck 30 is exaggerated for purposes of illustration. In practice, the degree of curvature is chosen to be large enough to encourage separation within unit 16 along damage region 18, but small enough to avoid undesired cracking or breakage at other locations within assembly 26.

Figure 7:
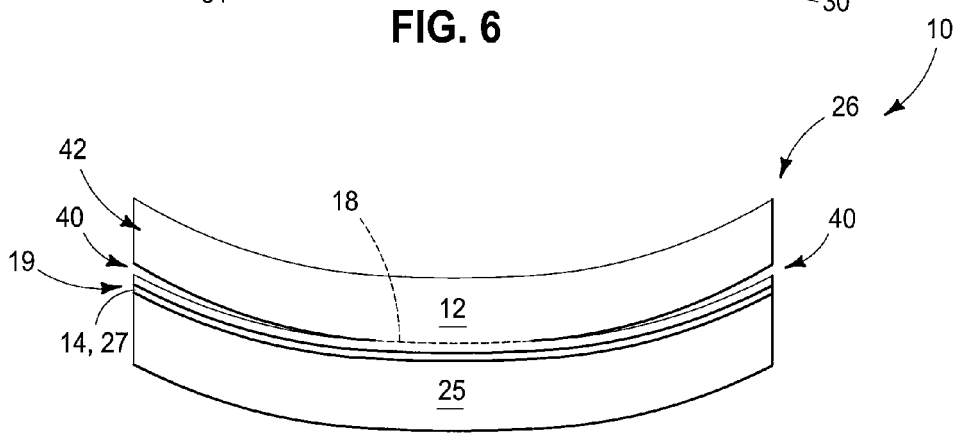
FIGS. 7-9 are diagrammatic, cross-sectional views of a construction analogous to that of FIG. 5, shown at a different scale than in FIGS. 5 and 6, and shown at various process stages of an example embodiment process.

FIG. 7 shows assembly 26 at a process stage in which the curvature along the surface of the chuck has begun to induce separation along the damage region 18. The view of FIG. 7 is at a different scale than the views of FIGS. 5 and 6 to enable the separation along the damage region to be clearly illustrated. Also, the assembly 26 is shown in isolation from the chuck in FIG. 7, but the chuck would be engaged with the assembly 26 at the process stage of FIG. 7, and would be inducing the shown contortion of the assembly which causes the separation along the damage region. The illustrated contortion (shown as bending of the assembly) is exaggerated to emphasize such contortion. In practice, the amount of contortion would be chosen to be large enough to be sufficient to induce separation along the damage region, and yet small enough to avoid undesired detrimental effects to the assembly.

FIG. 7 shows gaps 40 forming along edges of the damage region, and shows that the portion 19 of crystalline material 12 between the damage region and the dielectric material 14 is cleaved from a remaining portion 42 of the crystalline material. Although the gaps are shown initiating from edges of the damage region, in other embodiments the gaps may initiate at other locations along the damage region.

Figure 8:
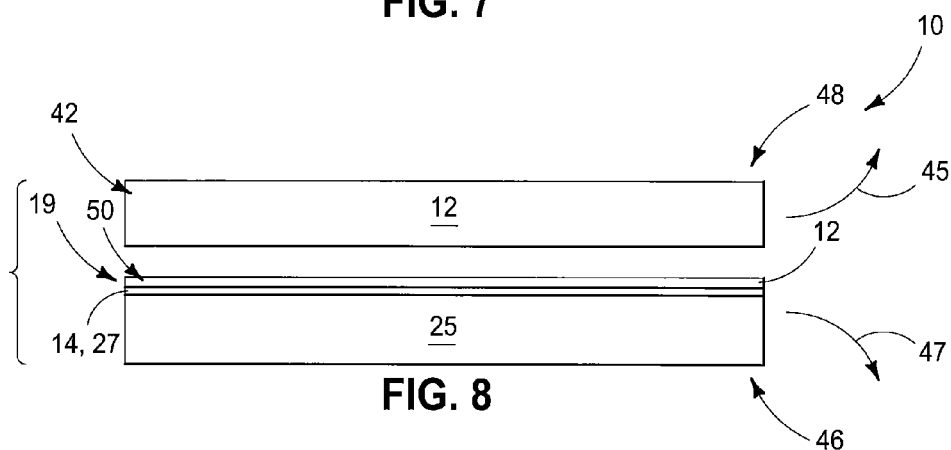

Referring to FIG. 8, the construction 10 is shown at a processing stage subsequent to that of FIG. 7, and specifically after the cleavage along damage region 18 (FIG. 7) has been completed. The construction has been split into two pieces 46 and 48. The piece 48 comprises the portion 42 of crystalline material 12 that had been on an opposing side of the damage region from the portion 19 of the crystalline material. The piece 46 comprises the portion 19 of the crystalline material 12 bonded to a handle comprising the wafer of the semiconductor material 25. The portion 19 may be considered to be a crystalline material structure 50.

The pieces 48 and 46 may be separated from one another and subjected to additional processing, as implied by the arrows 45 and 47. The piece 48 may be re-utilized to form another unit 16 which can then be subjected to the processing of FIGS. 1-8.

Figure 9:
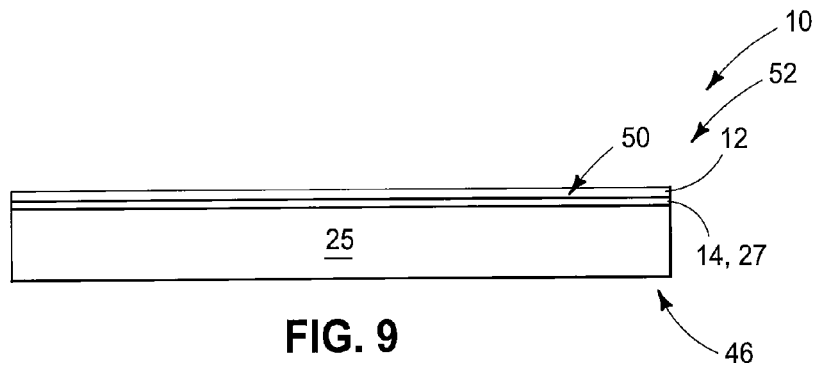

The piece 46 may be subjected to CMP, if desired, to smooth an upper surface of structure 50, and may be utilized as an SOI construction (with structure 50 being the semiconductor of the SOI, and with dielectric "14, 27" being the insulator of the SOI). FIG. 9 shows an SOI construction 52 comprising the piece 46. The semiconductor material 25 may be cut in subsequent processing (not shown) to thin the amount of material 25 beneath the insulator portion of the SOI, if so desired.

The structure 50 at the process stage of FIG. 9 may comprise all of the initial portion 19 that had been present before cleavage along damage region 18 (e.g., all of the portion 19 present at the processing stage of FIG. 6), or may comprise only some of such initial portion 19. For instance, part of the portion 19 may be lost in the processing stages described with reference to FIGS. 6-8; and/or may be lost in subsequent CMP.

The processing of FIGS. 6-8 utilizes a curved surface of a chuck to enhance cleavage along the damage region. The chuck-induced cleavage of FIGS. 6-8 may be conducted at any suitable temperature; and in some embodiments may be conducted at a temperature less than the temperatures commonly utilized to achieve cleavage with conventional smart-cut processes. For instance, in some embodiments the chuck-induced cleavage may be conducted at room temperature (i.e., about 22° C.). Even though the cleavage can be conducted at room temperature, there may be embodiments in which a thermal anneal is still desired (such as, for example, for dopant activation, for strengthening chemical bonds, etc.). In such embodiments, the thermal anneal may be conducted simultaneously with the cleavage, or before the cleavage, or after the cleavage.

An advantage of the processing of FIGS. 6-8 is that such may enable cleavage along a damage region while utilizing a lower dose of hydrogen to initially form the damage region than conventional processes. However, when a low dose of hydrogen is utilized to initially formed the damage region, there may be significant roughness present along a surface of structure 50 (FIG. 8) after the cleavage along the damage region. Such roughness may be comparable to that resulting from conventional smart-cut processes, and may be removed with CMP analogous to that utilized in the conventional smart-cut processes.

Another advantage of the processing of FIGS. 6-8 may be manifested if the dose of hydrogen utilized to form the damage region is comparable to that utilized in conventional smart-cut processes. Specifically, the processing of FIGS. 6-8 may enable the damage region to be cleaved without thermally expanding the damage region (i.e., without the processing stage of FIG. 4). Thus, the unit 16 of FIG. 1 may have the damage region 18 formed by the hydrogen implant (i.e., the processing of FIG. 2), and may then not be subjected to thermal processing which expands the damage region (i.e., may not be exposed to a temperature in excess of 300° C.) during the interval between the hydrogen implant and the cleavage along the damage region. The omission of the thermal expansion of the damage region may enable the cleavage to be attained while creating less roughness along the surface of structure 50 than would be created by conventional smart cut processes. This may enable structure 50 to be suitable for utilization in SOI with significantly less CMP-smoothing of the surface of structure 50 than is utilized in conventional smart-cut processes, and in some embodiments may enable structure 50 to be utilized in SOI with no CMP-smoothing of the surface of structure 50.

Figure 10:
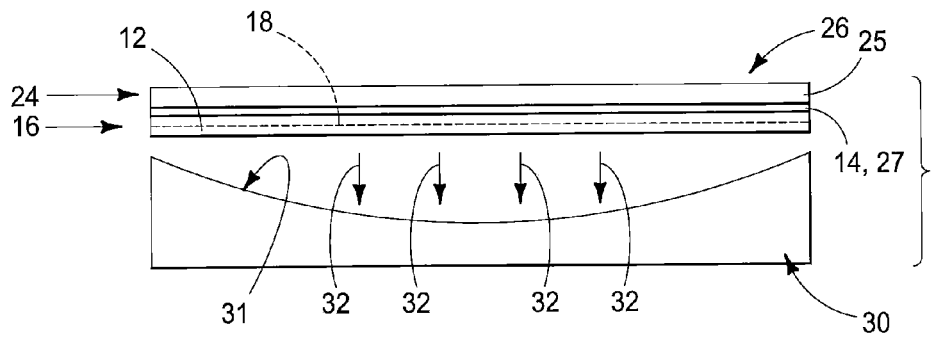
FIGS. 10 and 11 show additional example process stages that may be utilized with the construction of FIG. 5.

Although the embodiment of FIG. 6 shows the assembly 26 contorted with unit 16 being oriented above handle 24, in other embodiments the assembly may be flipped as shown in FIG. 10.

In some embodiments, the assembly 26 may be subjected to multiple contortions against one or more chucks to induce desired cleavage along a damage region. For instance, the assembly 26 may be contorted in the orientation of FIG. 6 and then flipped to be contorted in the orientation of FIG. 10, or vice versa.

Figure 11:
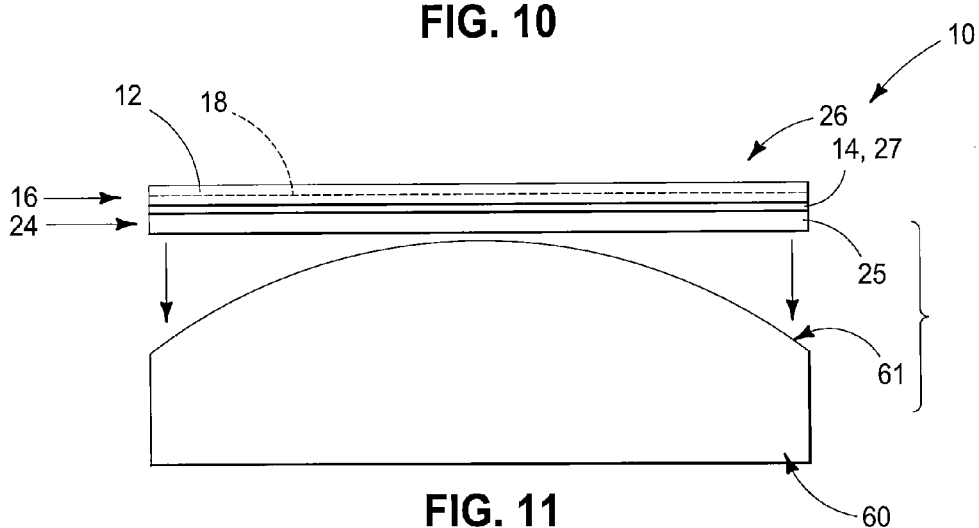

The chuck 30 of FIGS. 6 and 10 is one of many configurations of a chuck having a curved outer surface that may be utilized in some embodiments. The chuck 30 had a concave outer surface. FIG. 11 shows a processing stage analogous to that of FIG. 6, but utilizing a chuck 60 having a curved outer surface 61 with a convex topography. The illustrated degree of curvature of the surface of chuck 60 is exaggerated for purposes of illustration. In practice, the degree of curvature is chosen to be large enough to encourage separation within unit 16 along damage region 18, but small enough to avoid undesired cracking or breakage at other locations within assembly 26.

Figure 12:
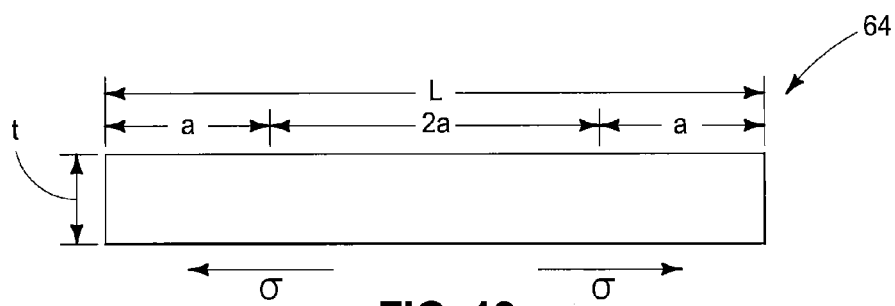
FIG. 12 shows a cross-sectional side view of a semiconductor wafer with various dimensions that may be utilized as input into an equation for ascertaining surface lateral stress (a) in some embodiments.

The cleavage induced along a damage region with a curved surface of a chuck may be related to the surface lateral stress (σ) of a unit (e.g., the unit 16 of FIG. 1). FIG. 12 shows a cross-sectional side view of a semiconductor wafer 64 with various dimensions that may be utilized as input into an equation for ascertaining surface lateral stress (σ) in some embodiments. Specifically, the surface lateral stress may be characterized by Equation I.

$$\sigma = \frac{12Eyt}{4a^2 - 3L^2} \quad \text{Equation I}$$

In Equation I, "E" is the Young's Modulus (168 GPa for Si), "y" is the total wafer vertical displacement, "t" is the total thickness of the wafer, "L" is the length of the wafer, and "a" is one-fourth of the length of the wafer. The wafer vertical displacement "y" relates to the amount of contortion induced by a chuck, and may be considered to correspond to, for example, the vertical displacement induced by the curved surface 31 in the embodiment of FIG. 6.

Figure 13:
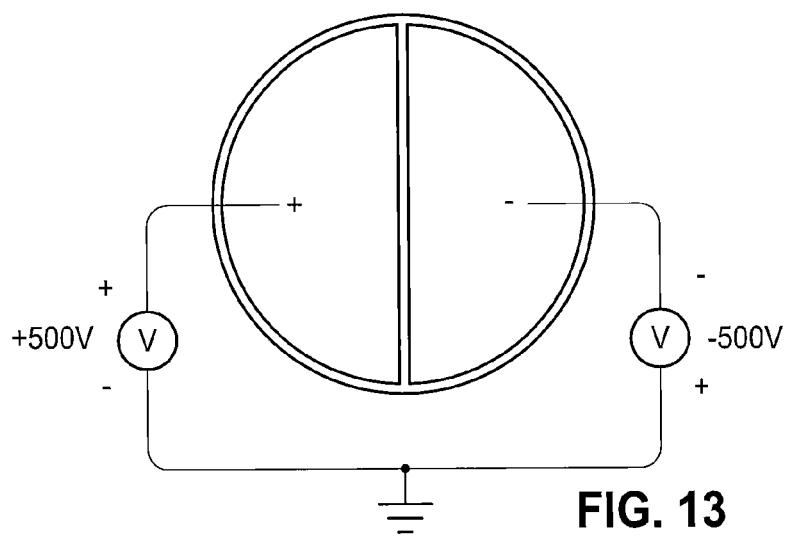
FIGS. 13-15 are diagrammatic views of example electrostatic chuck configurations that may be utilized in some example embodiments.
Figure 14:
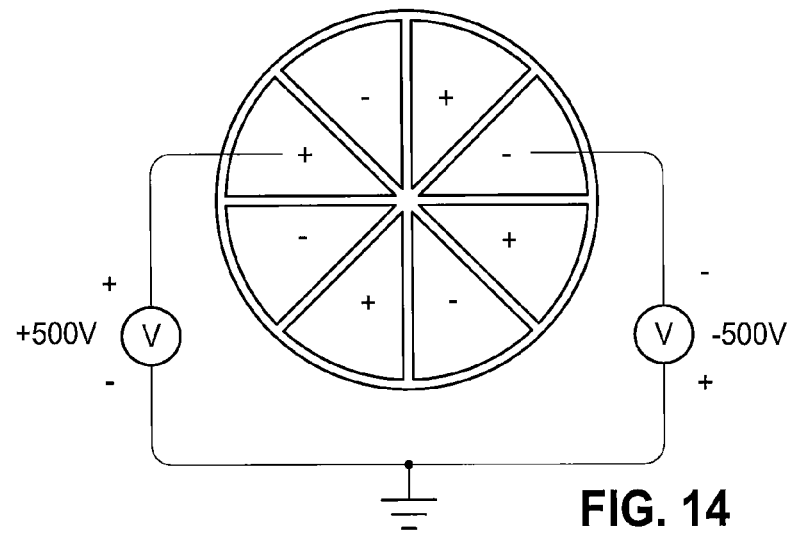
Figure 15:
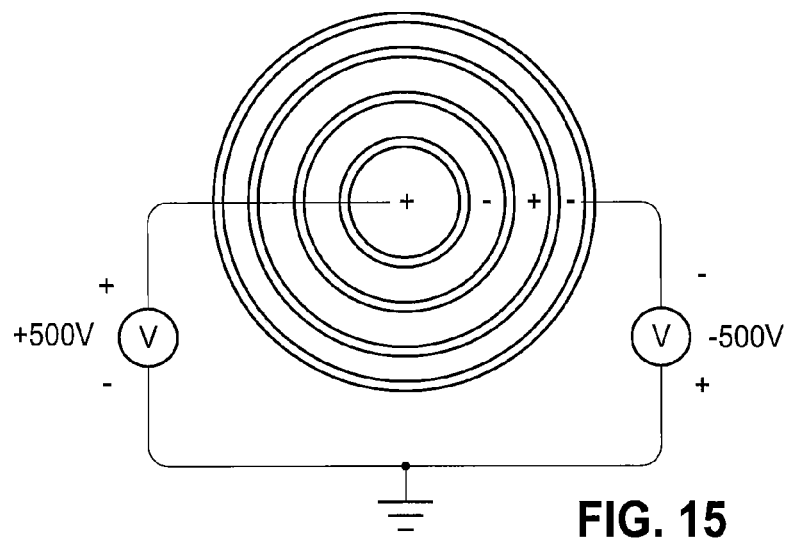

As discussed previously, the chucks utilized in various embodiments described herein may be electrostatic chucks. FIGS. 13-15 illustrate some example embodiments of electrostatic chucks that may be utilized. Each chuck may have an advantage for some embodiments, and a disadvantage for others. The voltages shown in FIGS. 13-15 are example voltages provided to assist the reader in understanding the operation of the chucks. Other voltages may be utilized in various embodiments.

The chuck of FIG. 13 is a D-shaped bi-polar configuration, the chuck of FIG. 14 is a pie-shaped multi-polar configuration, and the chuck of FIG. 15 is a ring-shaped multi-polar configuration. The bi-polar and multi-polar configurations advantageously do not need any "real" ground because they have a "virtual" ground, and thus they may be readily utilized for processes occurring under either vacuum or atmosphere. The bi-polar and multi-polar configurations may also have benefits including low-cost, uniform generation of forces, and reduced particle and metal contaminations.

The ring-shaped multi-polar configuration may be particularly attractive for electrostatic force enhanced cleavage along a damage region due to its uniform and uniaxial force, and flexible and programmable scheme.

Although the embodiments described above pertain to fabrication of SOI constructions, the invention includes embodiments directed toward other constructions comprising crystalline materials. Such other constructions may include, for example, Semiconductor-Metal-On-Insulator (SMOI) (which may be utilized, for example, for ultrahigh density vertical devices of three-dimensional DRAM and NAND), and Silicon-On-Polycrystalline Aluminum Nitride (SOPAN), (which may be utilized, for example, for LED fabrications).

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of processing a unit comprising crystalline material. A damage region is formed within the crystalline material. A portion of the unit is above the damage region. A chuck is used to bend the unit and thereby induce cleavage along the damage region to form a structure from the portion of the unit above the damage region.

Some embodiments include a method of forming a semiconductor-on-insulator construction. A unit is formed to comprise dielectric material over monocrystalline semiconductor material. A damage region is formed within the monocrystalline semiconductor material. A portion of the monocrystalline semiconductor material is between the damage region and the dielectric material. The unit is attached to a handle component through the dielectric material to form an assembly comprising the handle component and the unit. An electrostatic chuck is utilized to contort the assembly and thereby induce cleavage along the damage region and form the semiconductor-on-insulator construction. The semiconductor-on-insulator construction comprises the dielectric material as the insulator, and comprises at least some of said portion of the semiconductor material as the semiconductor.

Some embodiments include a method of forming a semiconductor-on-insulator construction. A unit is formed to comprise dielectric material over monocrystalline semiconductor material. A damage region is formed within the monocrystalline semiconductor material. A portion of the monocrystalline semiconductor material is between the damage region and the dielectric material. The unit is attached to a handle component through the dielectric material to form an assembly comprising the handle component and the unit. The assembly is contorted along a curved outer surface of a chuck to thereby induce cleavage along the damage region and form the semiconductor-on-insulator construction. The semiconductor-on-insulator construction comprises the dielectric material as the insulator, and comprises at least some of said portion of the semiconductor material as the semiconductor.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor-on-insulator construction, comprising:
    forming a unit comprising dielectric material over monocrystalline semiconductor material;
    forming a damage region within the monocrystalline semiconductor material, a portion of the monocrystalline semiconductor material being between the damage region and the dielectric material;
    attaching the unit to a handle component through the dielectric material to form an assembly comprising the handle component and the unit;
    utilizing an electrostatic chuck to contort the assembly and thereby induce cleavage along the damage region and form the semiconductor-on-insulator construction; the semiconductor-on-insulator construction comprising the dielectric material as the insulator, and comprising at least some of said portion of the semiconductor material as the semiconductor;
    wherein the forming the damage region comprises implanting hydrogen into the monocrystalline semiconductor material; and
    wherein the hydrogen is implanted at a dose of from about $2 \times 10^{16}$ particles/cm$^2$ to about $5 \times 10^{16}$ particles/cm$^2$.

2. The method of claim 1 further comprising expanding the damage region with a thermal anneal after attaching the unit to the handle component and prior to inducing the cleavage.

3. A method of forming a semiconductor-on-insulator construction, comprising:

forming a unit comprising dielectric material over monocrystalline semiconductor material;

forming a damage region within the monocrystalline semiconductor material, a portion of the monocrystalline semiconductor material being between the damage region and the dielectric material;

attaching the unit to a handle component through the dielectric material to form an assembly comprising the handle component and the unit;

utilizing an electrostatic chuck to contort the assembly and thereby induce cleavage along the damage region and form the semiconductor-on-insulator construction; the semiconductor-on-insulator construction comprising the dielectric material as the insulator, and comprising at least some of said portion of the semiconductor material as the semiconductor;

wherein the forming the damage region comprises implanting hydrogen into the monocrystalline semiconductor material; and wherein the hydrogen is implanted at a dose of at least about $1\times10^{17}$ particles/cm$^2$.

4. The method of claim 3 wherein the unit is not exposed to a temperature in excess of 300° C. during an interval between the hydrogen implant and the cleavage.

5. A method of forming a semiconductor-on-insulator construction, comprising:

forming a unit comprising dielectric material over monocrystalline semiconductor material;

forming a damage region within the monocrystalline semiconductor material, a portion of the monocrystalline semiconductor material being between the damage region and the dielectric material;

attaching the unit to a handle component through the dielectric material to form an assembly comprising the handle component and the unit;

contorting the assembly along a curved outer surface of a chuck to thereby induce cleavage along the damage region and form the semiconductor-on-insulator construction; the semiconductor-on-insulator construction comprising the dielectric material as the insulator, and comprising at least some of said portion of the semiconductor material as the semiconductor; and wherein the contorting comprises engaging the assembly along the curved outer surface while the assembly is in a first orientation relative to the curved outer surface, and then flipping the assembly and engaging the assembly along the curved outer surface while the assembly in a second orientation relative to the curved outer surface, with the second orientation being opposite to the first orientation.

\* \* \* \* \*